(12) United States Patent
Lee et al.

(10) Patent No.: US 11,856,698 B2
(45) Date of Patent: Dec. 26, 2023

(54) CIRCUIT BOARD AND DISPLAY DEVICE INCLUDING THE SAME

(71) Applicant: SAMSUNG DISPLAY CO., LTD., Yongin-si (KR)

(72) Inventors: Jongjin Lee, Yongin-si (KR); Jihun Lee, Seoul (KR); Hyungchul Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 263 days.

(21) Appl. No.: 17/227,551

(22) Filed: Apr. 12, 2021

(65) Prior Publication Data

US 2022/0053643 A1    Feb. 17, 2022

(30) Foreign Application Priority Data

Aug. 14, 2020    (KR) .......................... 10-2020-0102235

(51) Int. Cl.
| | |
|---|---|
| H05K 1/14 | (2006.01) |
| H01L 25/18 | (2023.01) |
| G02F 1/1345 | (2006.01) |
| H05K 1/18 | (2006.01) |
| G06F 3/044 | (2006.01) |
| G06F 3/041 | (2006.01) |
| G02F 1/1333 | (2006.01) |
| H10K 59/40 | (2023.01) |

(52) U.S. Cl.
CPC ......... *H05K 1/147* (2013.01); *G02F 1/13452* (2013.01); *G06F 3/0446* (2019.05); *G06F 3/04164* (2019.05); *H01L 25/18* (2013.01); *H05K 1/181* (2013.01); *G02F 1/13338* (2013.01); *H05K 2201/057* (2013.01); *H05K 2201/09227* (2013.01); *H05K 2201/09509* (2013.01); *H05K 2201/10128* (2013.01); *H05K 2201/10136* (2013.01); *H10K 59/40* (2023.02)

(58) Field of Classification Search
None
See application file for complete search history.

(56) References Cited

U.S. PATENT DOCUMENTS

| | | | |
|---|---|---|---|
| 9,426,882 B2 | 8/2016 | Kim et al. | |
| 11,589,461 B2* | 2/2023 | Xiong | H05K 1/111 |
| 2020/0218399 A1 | 7/2020 | Maeng et al. | |
| 2021/0193764 A1* | 6/2021 | Cho | G09G 3/3266 |
| 2021/0219423 A1* | 7/2021 | Xiong | H05K 1/111 |
| 2021/0223914 A1* | 7/2021 | Noh | G06F 3/0445 |
| 2021/0268402 A1* | 9/2021 | Levy | C30B 7/00 |
| 2021/0335982 A1* | 10/2021 | Dong | H10K 71/00 |

(Continued)

FOREIGN PATENT DOCUMENTS

| | | |
|---|---|---|
| KR | 10-0665244 | 1/2007 |
| KR | 10-1871667 | 6/2018 |

(Continued)

*Primary Examiner* — Fred Tzeng
(74) *Attorney, Agent, or Firm* — F. CHAU & ASSOCIATES, LLC

(57) ABSTRACT

An apparatus includes a first circuit board, a driving chip, and a second circuit board. The driving chip is coupled to the first circuit board, and the second circuit board is spaced apart from and electrically connected to the driving chip. At least part of the second circuit board is spaced apart from a first surface of the first circuit board.

21 Claims, 10 Drawing Sheets

(56) References Cited

U.S. PATENT DOCUMENTS

2021/0397302 A1\* 12/2021 Yang ................ G06F 3/0412
2022/0057910 A1\* 2/2022 Xiong ............... G06F 3/04164
2022/0397998 A1\* 12/2022 Jiang ................ G06F 3/04164

FOREIGN PATENT DOCUMENTS

| KR | 10-1900333 | 9/2018 |
| KR | 10-2078855 | 2/2020 |

\* cited by examiner

CIRCUIT BOARD AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2020-0102235, filed on Aug. 14, 2020, the entire contents of which are hereby incorporated by reference.

BACKGROUND

1. Field of the Disclosure

One or more embodiments disclosed herein relates to a circuit board and a display device including a circuit board.

2. Description of Related Art

Many electronic devices are equipped with a display. Examples include televisions, mobile phones, tablet computers, navigators, and game players. The display may have a display module having a display panel, an input sensing layer, and a circuit board. The display panel may displays image, the input sensing layer may sense external inputs, and the circuit board may provide electrical signals to drive the display panel and input sensing layer. To provide these signals, the circuit board is connected to one of the display panel or input sensing layer.

SUMMARY

One or more embodiments provide a circuit board having one or more signal lines that are arranged to achieve increased efficiency. One or more other embodiments may include a display device equipped with such a circuit board.

In accordance with one embodiment, an apparatus includes a first circuit board, a driving chip coupled to the first circuit board, and a second circuit board spaced apart from and electrically connected to the driving chip. The second circuit board is a flexible circuit board, and at least part of the second circuit board is spaced apart from a first surface of the first circuit board in a bridge structure.

In accordance with one embodiment, a display device includes a substrate, a display element layer on the substrate, an input sensing layer arranged on the display element layer and comprising a sensing electrode, and a board arrangement electrically bonded to one end of the substrate. The board arrangement includes a first circuit board coupled to the one end of the substrate, a driving chip arranged on the first circuit board and electrically connected to the sensing electrode, and a second circuit board electrically connected to the driving chip and comprising an adhesion part arranged on a first surface of the first circuit board and a spaced part spaced apart from the first surface of the first circuit board.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
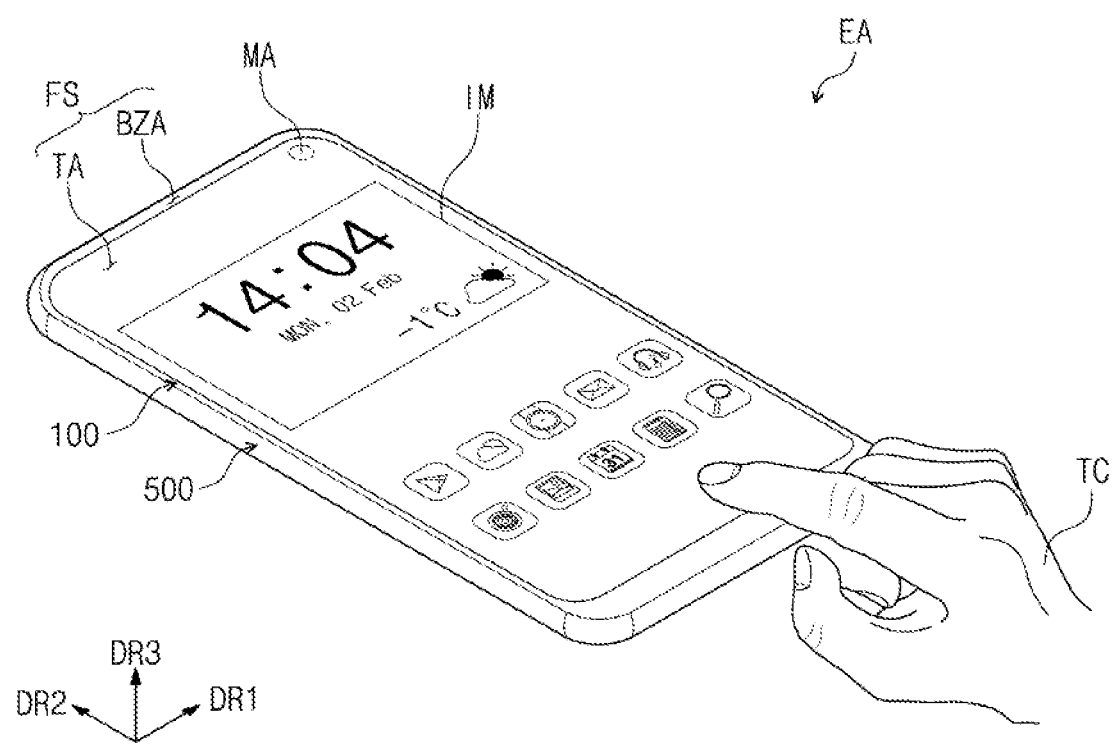
FIG. 1 illustrates an embodiment of an electronic device.

It will be understood that when an element or layer is referred to as being "on", "connected to" or "coupled to" another element or layer, it can be directly on, connected or coupled to the other element or intervening third elements may be present. Like reference numerals in the drawings refer to like elements. In addition, in the drawings, the thickness and the ratio and the dimension of the element are exaggerated for effective description of the technical contents. The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the present disclosure. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which example embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof. Hereinafter, embodiments of the inventive concept will be described with reference to the accompanying drawings.

Figure 2:
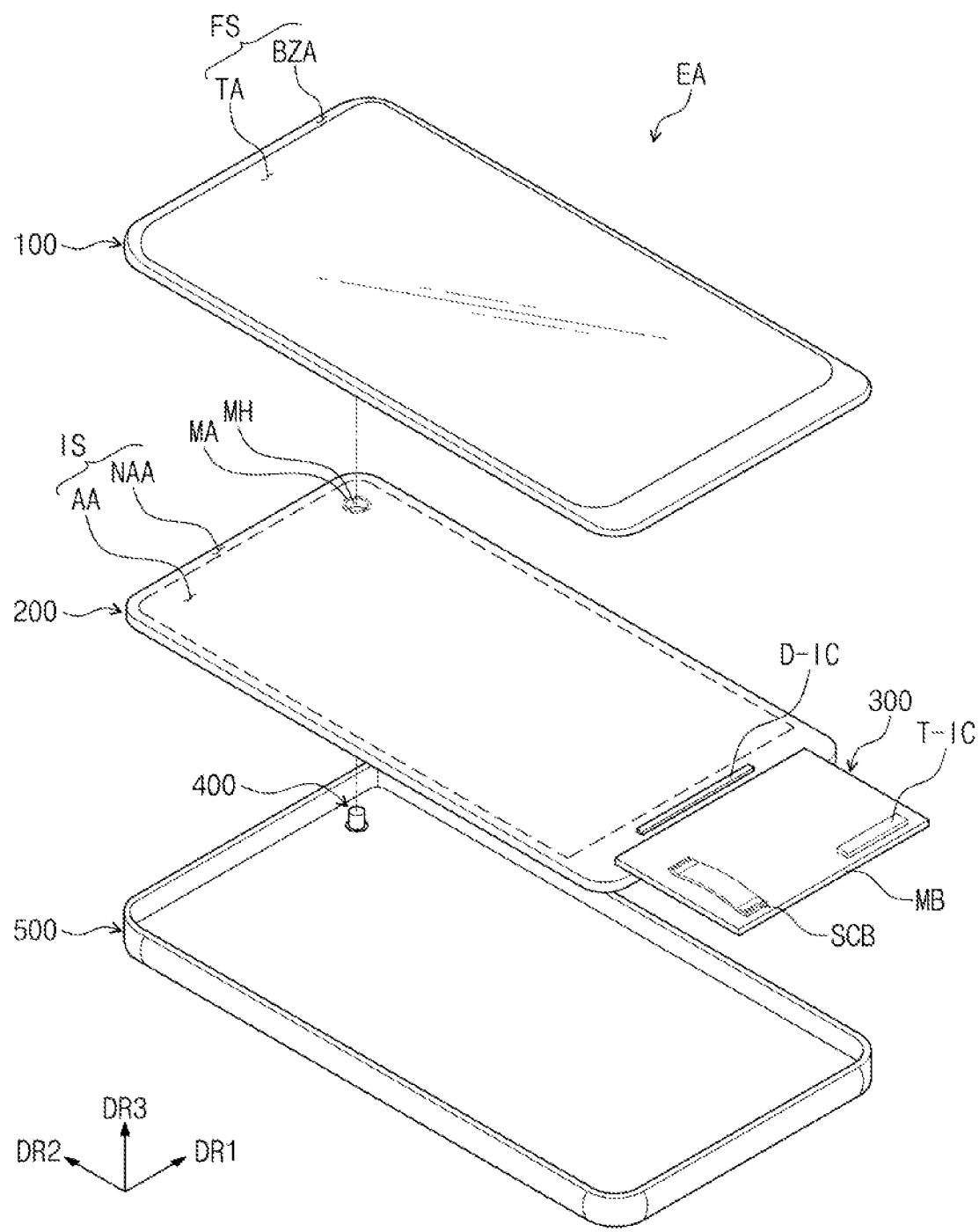
FIG. 2 illustrates an exploded perspective view of the electronic device.

FIG. 1 is a perspective view of an electronic device EA in a coupled state according to an embodiment, and FIG. 2 is an exploded perspective view of the electronic device in a decoupled state according to an embodiment. The electronic device EA may be activated based on one or more electrical signals and may be implemented in various embodiments. For example, electronic device EA may be implemented as a tablet, a notebook computer, a computer, or a smart television, etc. The electronic device EA is illustrated as a smartphone for illustrative purposes.

Referring to FIG. 1, electronic device EA may display an image IM through a front surface FS, which, for example, may include a transmission area and a bezel area BZA adjacent to the transmission area TA. The front surface FS may be parallel to a plane denoted by a first direction DR1 and a second direction DR2. The normal direction of the front surface (e.g., the thickness direction of the electronic device EA) may be indicated by a third direction DR3. In the present specification, a plan view or a perspective viewed from a plane correspond to a view taken from the perspective of the third direction DR3. In one embodiment, the front (or top) surfaces and the rear (or bottom) surfaces of respective layers or units, as described hereinafter, may be divided by the third direction DR3. However, the directions indicated by the first to third directions DR1, DR2, and DR3 are relative concepts and may be changed to other directions, for example, the opposite directions.

The electronic device EA displays the image IM through the transmission area TA. The image IM may include at least one of a still image or a moving image. As an example of the image IM, FIG. 1 illustrates a clock window and a plurality of icons. The transmission area TA has a predetermined (e.g., rectangular) shape. When the shape is rectangular, the transmission area TA may have sides parallel to respective ones of the first direction DR1 and the second direction DR2. The transmission area TA may have a different shape in another embodiment. The bezel area BZA may surround the transmission area TA. However, this is merely exemplary. The bezel area BZA may be disposed adjacent only to one side of the transmission area TA, or in one embodiment may be omitted altogether.

In one embodiment, the electronic device EA may sense an external input TC, e.g., an input generated by contact with a body part of a user, stylus pen, or other object. In addition to the body part of a user, the user input TC may be generated by light, heat, or pressure. In addition, the electronic device EA may sense an input contiguous or adjacent thereto as well as a contacting input.

In the present embodiment, the external input TC is illustrated as the finger of a user contacting front surface FS. However, this is merely exemplary, and as described above the external input TC may be provided in various ways. According to the structure of the electronic device EA, the external input TC applied to the side surface or rear surface of the electronic device EA may also be sensed, and is not limited to any one embodiment.

With reference to FIG. 2, the electronic device EA may include a window 100, a display module 200, a circuit board 300, an electronic module 400, and an external case 500. The window 100 and the external case 500 are coupled to define the appearance of the electronic device EA.

The window 100 is provided on the display module 200 to cover the front surface IS of the display module 200. The window 100 may include an insulation material (e.g., glass or plastic) that is optically transparent. The window 100 may have a multilayer structure or a single-layer structure. For example, the window 100 may have a laminated structure of a plurality of plastic films bonded with an adhesive, or a laminated structure of a glass substrate and a plastic film bonded with an adhesive.

The window 100 includes the front surface FS which may be externally exposed substantially delineated by the front surface FS of the window. The transmission area TA may be an optically transparent area and, for example, may have a shape corresponding to an active area AA in the display module 200. For example, the transmission area TA may overlap the entire surface or at least a part of the active area AA. The image IM displayed in the active area AA of the display module 200 may be externally visible through the transmission area TA.

The bezel area BZA may have relatively low optical transmittance in comparison to the transmission area TA and, for example, may delineate the shape of the transmission area TA. In one embodiment, the bezel area BZA may be adjacent to and surround the transmission area TA. The bezel area BZA may have a prescribed color. When the window 100 includes a glass or plastic substrate, the bezel area BZA may be a color layer printed or deposited on one surface of the glass or plastic substrate. In one embodiment, the bezel area BZA may be formed by coloring the corresponding area of the glass or plastic substrate. Moreover, the bezel area BZA may cover a non-active area NAA of the display module 200 to block the non-active area NAA from being externally visible. In one embodiment, the bezel area BZA may be omitted.

The display module 200 may include a display panel DP and an input sensing layer ISU, an embodiment of which is described with reference to FIG. 3. The display panel DP may include features which at least substantially generate the image IM. The image IM is generated by the display panel DP to be externally visible to a user through the transmission area TA. The input sensing unit ISU senses externally input TC.

According to an embodiment of the inventive concept, the front surface IS of the display module 200 includes a first area and a second area adjacent to the first area. The first area may correspond to a module area MA and the active area AA surrounding the module area MA. The second area may correspond to the non-active area NAA. The active area AA may be a display area activated according to one or more electrical signals. The module area MA and the second area may be correspond to a non-display area in which images are not displayed.

The active area AA may be a display area in which images IM are displayed, and may also be or include a sensing area in which external input TC is sensed. The transmission area TA overlaps at least the active area AA, e.g., the transmission area TA may overlap the entire surface or at least part of the active area AA. Accordingly, a user may visually recognize images IM or may provide an external input TC through the transmission region TA. However, the above-described features are mere non-limiting examples. In one embodiment, the active area AA may be divided into an area in which the image IM is displayed and an area in which the external input TC is sensed.

The non-active area NAA may be covered with the bezel area BZA and may be adjacent to the active area AA. In one embodiment, the non-active area NAA may surround the active area AA. Various kinds of signal lines or pads or electronic elements, etc., for providing electrical signals to the active area AA may be arranged in the non-active area NAA. For example, as shown in FIG. 2, a pixel driving chip D-IC for providing electrical signals may be arranged in or adjacent to the active area AA. In one embodiment, the pixel driving chip D-IC may output electrical signals to generate images to be displayed through the active area AA. The non-active area NAA may be covered with the bezel area BZA and may not be externally visible.

In the present embodiment, the display module 200 may be assembled in a flat state, in which the active area AA and the non-active area NAA face the window 100. However, this is merely exemplary. In one case, part of the non-active area NAA in the display module 200 may be curved. Here, part of the non-active area NAA may face the rear surface of the electronic device EA, which may result in reduction in the bezel area BZA in the front surface of the electronic device EA. In one embodiment, the display module 200 may be assembled in a state where part of the active area AA is also curved. In one embodiment, the non-active area NAA may be omitted in the display module 200.

The module area MA may have a relatively higher transmissivity than the active area AA for the same or similar area. At least part of the module area MA may be surrounded by the active area AA. In the present embodiment, the module area MA is spaced apart from the non-active area. The module area MA is illustrated to be inside the active area AA in this embodiment. At this position, all or a predetermined number of boundaries may be surrounded by the active area AA.

In one embodiment, the display module 200 may be inside the module area MA to include a panel hole MH penetrating through the display module 200. The panel hole MH may penetrate through at least any one of the display panel DP or the input sensing layer ISU. The boundary of the module area MA may be substantially spaced apart by a prescribed interval from the boundary of the panel hole MH, to extend along the boundary of the panel hole MH. The boundary of the module area MA may have a predetermined shape, e.g., a shape corresponding to the panel hole MH.

A circuit board 300 (or board arrangement) may be connected to one end of the display module 200 and may provide various electrical signals for driving the display module 200 to the display module 200. For example, the circuit board 300 may provide image signals to the pixel driving chip D-IC and may provide sensing signals to drive the input sensing layer ISU (e.g., see FIG. 3). According to an embodiment of the inventive concept, the circuit board 300 may be flexible or rigid. In at least some embodiments, the circuit board 300 will be described as a flexible printed circuit board for example purposes.

The circuit board 300 may include a main (or first) circuit board MB, a sub-circuit (or second circuit) board SCB, and a sensing driving chip T-IC. The main circuit board MB may be a base layer for supporting a plurality of signal lines, the sub-circuit board SCB, and the sensing driving chip T-IC. The sensing driving chip T-IC may be arranged on the main circuit board MB and may be electrically connected to the display module 200 through the signal lines. The sensing driving chip T-IC may generate a sensing signal for sensing external input TC and/or for processing the sensed signal.

The sensing driving chip T-IC and the plurality of signal lines may be arranged on the main circuit board MB. For example, the signal lines may include a plurality of first signal lines electrically connected to the sensing driving chip T-IC (e.g., see FIG. 6) and a plurality of second signal lines (e.g., see FIG. 8) for providing electrical signals to a pixel driving chip D-IC (e.g., shown in FIG. 8). As the resolution of the image increases, the number of the second signal lines for delivering image signals to the pixel driving chip D-IC may increase. As a result, the area in which the first signal lines (for providing the sensing signals to the sensing driving chip T-IC) are arranged on the main circuit board MB may be narrowed.

According to an embodiment of the inventive concept, the sub-circuit board SCB may be arranged on the main circuit board MB. The sub-circuit board SCN may be, for example, a flexible printed circuit board and at least part of the sub-circuit board SCB may be spaced apart from the top (or first) surface of the main circuit board MB in a bridge structure. The sub-circuit board SCB may be arranged to be spaced apart from the second signal lines electrically connected to the pixel driving chip D-IC.

The second signal lines may therefore be arranged on the main circuit board MB, and the first signal lines (which are electrically connected to the sensing driving chip T-IC) may be arranged on the sub-circuit board SCB that at least partially overlaps the second signal lines. For example, a double arrangement structure may be provided in which the first signal lines and the second signal lines overlap each other and are arranged on different layers. An example of such a sub-circuit board SCB will described with reference to FIG. 6.

The electronic module 400 is arranged under the window 100 and may overlap the panel hole MH defined in the module area MA. The electronic module 400 may receive an external input through the module area MA or may provide an output through the module area MA. In the electronic module 400, a receiver to receive an external input or an output circuit to provide an output may overlap the module area MA in a plan view. A portion or the entirety of the electronic module 400 may be accommodated in the module area MA or the panel hole MH. According to an embodiment of the inventive concept, the electronic module 400 is arranged to overlap the active area AA, and thus the area of the bezel area BZA may be reduced.

Figure 3:
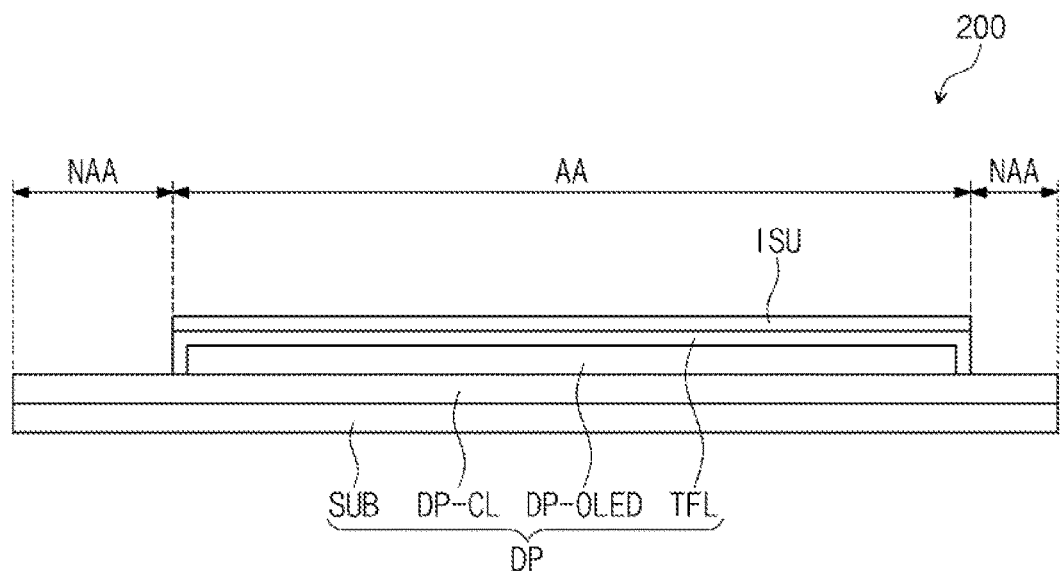
FIG. 3 illustrates an embodiment of a display module.

FIG. 3 is a cross-sectional view of an embodiment of display module 200, which may include a display panel DP and an input sensing layer ISU arranged on display panel DP.

Referring to FIG. 3, the display panel DP may include a substrate SUB, a circuit element layer DP-CL arranged on the substrate SUB, a display element layer DP-OLED, and an encapsulation layer TFL. The substrate SUB may include at least one plastic film. In one embodiment, the substrate SUB may include a plastic substrate as a flexible substrate, a glass substrate, a metal substrate, an organic/inorganic composite material substrate, or another type of substrate. The substrate SUB may be, for example, a member for supporting components of the display panel DP and may be described as a display substrate in accordance with one or more embodiments of the present specification.

The circuit element layer DP-CL may include at least one intermediate insulation layer and a circuit element. The intermediate insulation layer may include at least one intermediate inorganic film and/or at least one intermediate organic film. The circuit element may include one or more signal lines and a driving circuit of one or more pixels, etc.

The display element layer DP-OLED includes a plurality of organic light emitting diodes. The display element layer DP-OLED may further include an organic film such as a pixel definition layer. According to one embodiment, when the display panel includes a liquid crystal display panel, the display element layer may include a liquid crystal layer.

The encapsulation layer TFL encapsulates the display element layer DP-OLED. For example, the encapsulation layer TFL may include a thin-film encapsulation layer. The encapsulation layer TFL protects the display element layer DP-OLED from foreign material, such as moisture, oxygen, dust particles, etc. In one embodiment of the inventive concept, an encapsulation substrate may be provided instead of the encapsulation layer TFL. In this case, the encapsulation substrate may be opposite to the substrate SUB, and the circuit element layer DP-CL and the display element layer DP-OLED may be arranged between the encapsulation substrate and the substrate.

The input sensing layer ISU may be arranged on the encapsulation layer TFL and may sense an externally applied input. The externally applied input may be various types. For example, the external input may be generated based on contact with a part of the user's body or a stylus pen. Additionally, the external input may be generated based on light, heat, and/or pressure. In addition to contact with a part of the body a user, in one or more embodiments the input may be generated based on a spatial touch (e.g., hovering) of a proximal or adjacent input.

The input sensing layer ISU may be directly arranged on the encapsulation layer TFL. In the present specification, that "component A is directly arranged on component B" may correspond to the case where an adhesive layer is not arranged between component A and component B. In the present embodiment, the input sensing layer ISU and the display panel DP may be manufactured through one or more successive processes. In one embodiment, the input sensing unit ISU may be provided as an individual panel and may be coupled with the display panel DP through an adhesive layer.

Figure 4:
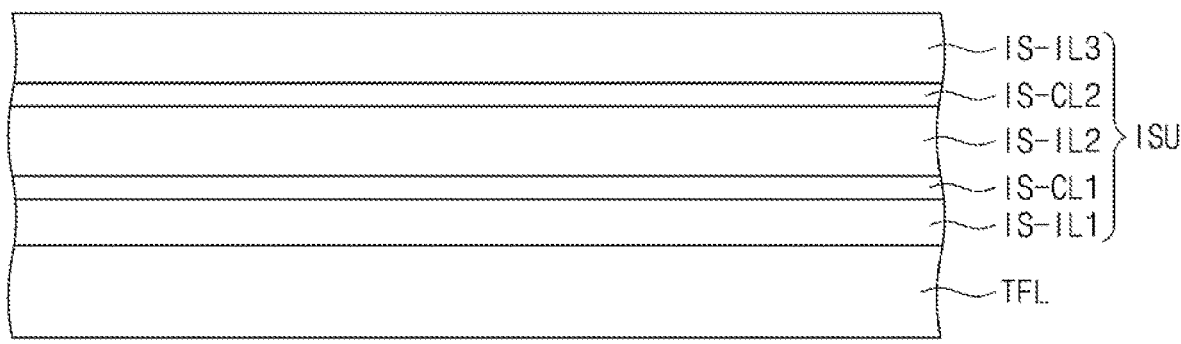
FIG. 4 illustrates an embodiment of an input sensing layer.
Figure 5:
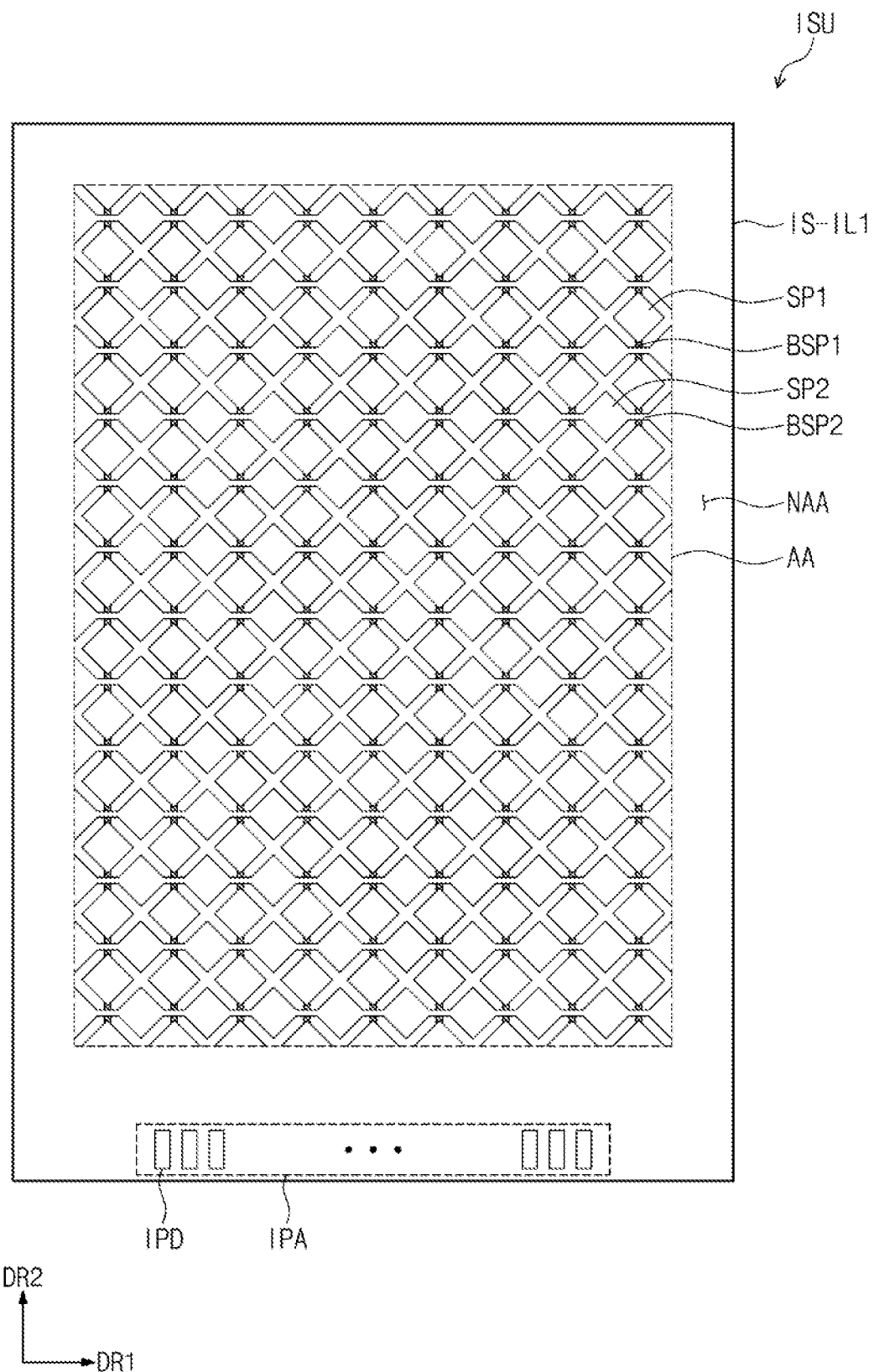
FIG. 5 illustrates an embodiment of the input sensing layer.

FIG. 4 is a cross-sectional view of input sensing layer ISU according to an embodiment of the inventive concept, and FIG. 5 is a plan view of input sensing layer ISU according to an embodiment of the inventive concept.

Referring to FIG. 4, the input sensing layer ISU may include a first sensing insulation layer IS-IL1, a first conductive layer IS-CL1, a second sensing insulation layer IS-IL2, a second conductive layer IS-CL2, and a third sensing insulation layer IS-IL3. The first sensing insulation layer IS-IL1 may be directly arranged on the encapsulation layer TFL. However, the technical spirit of the inventive concept is not limited thereto. In one embodiment, the first sensing insulation layer IS_IL1 may be omitted. In this case, the first conductive layer IS-CL1 may be directly arranged on the encapsulation layer TFL.

Each of the first conductive layer IS_CL1 and the second conductive layer IS-CL2 may have a single layer structure, or may have a multilayer structure laminated along the third direction DR3. The conductive layers of the multilayer structure may include at least two transparent conductive layers, at least two metal layers, or at least one transparent conductive layer and at least one metal layer. The conductive layers of the multilayer structure may include metal layers including different metals.

According to an embodiment of the inventive concept, the first conductive layer IS-CL1 may include molybdenum, silver, titanium, copper, aluminum, and an alloy thereof. In one embodiment, the first conductive layer IS-CL1 may have a three-layer structure of titanium/aluminum/titanium, which is a metal layer structure. A metal having relatively high durability and low reflectivity may be applied to an outer layer, and a metal having high electrical conductivity may be applied to an inner layer. The second conductive layer IS-CL2 may be a transparent conductive layer including, for example, indium tin oxide (ITO), indium zinc oxide (IZO), zinc oxide (ZnO), indium tin zinc oxide (ITZO), PEDOT, a metal nanowire, or graphene, etc. However, the inventive concept is not limited thereto, and the conductive layer structure in the first conductive layer IS-CL1 and the second conductive layer IS-CL2 may be modified in various ways. For example, the first conductive layer IS-CL1 may be a transparent conductive layer and the second conductive layer IS-CL2 may be a metal layer.

Each of the first insulation layer IS-IL1 to the third insulation layer IS-IL3 may include an inorganic film or an organic film. In the present embodiment, the first insulation layer IS-IL1 may be an inorganic film. However, the inventive concept is not limited thereto. In one embodiment, the first sensing insulation layer IS-IL1 and the second sensing insulation layer IS-IL2 may be inorganic layers, and the third sensing insulation layer IS-IL3 may be provided as an organic layer.

Referring to FIG. 5, the input sensing layer ISU may include an active area AA and a non-active area NAA adjacent to the active area AA. The active area AA may correspond to the transmission area TA of the window WM, for example, as discussed with reference to FIG. 2. The non-active area NAA may correspond to the bezel area BZA of the window WM.

In one embodiment, the input sensing layer ISU may include first sensing electrodes, second sensing electrodes, first connection units BSP1, second connection units BSP2, and sensing pads IPD. The first sensing electrodes, the second sensing electrodes, the first connection units BSP1, and the second connection units BSP2 may overlap the active area AA, and the sensing pads IPD may overlap the non-active area NAA.

According to an embodiment, the first sensing electrodes, the second sensing electrodes, and the second connection units BSP2 may be arranged on the same layer (either partially or fully), and the first connection units BSP1 may be arranged on a layer different therefrom. However, the inventive concept is not limited thereto. For example, the arrangement structure of the first sensing electrodes, the second sensing electrodes, the first connection units BSP1, and the second connection units BSP2 may be modified in various ways.

The first sensing electrodes may have a shape which extends in the first direction DR1 and which are arranged in the second direction DR2. In one embodiment, n first sensing electrodes may be provided, where n is a natural number. The first sensing electrodes may respectively include a plurality of first sensing units SP1 spaced apart from each other and arranged in the first direction DR1 in a plan view.

The second sensing electrodes may have a shape which extends in the second first direction DR2 and which are arranged in the first direction DR1. In one embodiment, m second sensing electrodes may be provided, where m is a natural number. The second sensing electrodes may respectively include a plurality of second sensing units SP2 spaced apart from each other and arranged in the second direction DR2 in a plan view. The second sensing units SP2 may be spaced apart and insulated from the first sensing units SP1 in a plan view.

The first connection units BSP1 may connect the first sensing units SP1 to each other. For example, one first connection unit BSP1 may electrically connect two first sensing units SP1 neighboring in the first direction DR,1 among the first sensing units SP1.

The second connection units BSP2 may connect the second sensing units SP2 to each other. For example, one second connection unit BSP2 may electrically connect two second sensing units SP2 neighboring in the second direction DR2, among the second sensing units SP2. According to an embodiment of the inventive concept, the second connection units BSP and the second sensing units SP2 may have an integrated shape formed in the same process, or may be formed in different processes. The first connection unit BSP1 and the second connection unit BSP2 may cross with each other in a plan view, and may be insulated from each other in a cross-sectional view.

According to an embodiment of the inventive concept, the first sensing units SP1, the second sensing units SP2, and the second connection units BSP2 may be formed of the same or substantially the same materials and through the same process or different processes, and may be included in the second conductive layer IS-CL2, for example, as described with reference to FIG. 4. In one embodiment, the first sensing units SP1, the second sensing units SP2, and the second connection units BSP2 may be directly arranged on the second sensing insulation layer IS-IL2.

According to an embodiment of the inventive concept, the first connection units BSP1 may be included in the first conductive layer IS-CL1, for example, as described in FIG. 4. The first connection units BSP1 may be directly arranged on the first sensing insulation layer IS-IL1 and may be electrically connected to the first sensing units SP1 through contact holes defined in the first sensing insulation layer IS-IL1.

The components in the first conductive layer IS-CL1 and the second conductive layer IS-CL2 are not limited to the above-described embodiments and may be modified in various ways. For example, the first sensing units SP1, the second sensing units SP2, and the second connection units BSP2 may be included in the first conductive layer IS-CL1, and the first connection units BSP1 may be included in the second conductive layer IS-CL2.

The first sensing electrodes, the second sensing electrodes, the first connection units BSP1, and the second connection units BSP2 may be described as sensing electrodes. The sensing pads IPD may output sensing signals to the sensing electrodes arranged in the active area AA or may receive sensed signals. In one embodiment, the input sensing layer ISU may further include sensing signal lines to electrically connect the sensing pads IPD and the sensing electrodes.

According to an embodiment of the inventive concept, the sensing pads IPD may receive the sensing signals output from the sensing driving chip T-IC, for example, as shown in FIG. 2. For example, the sensing pads IPD may be electrically connected to the circuit board 300 (e.g., see FIG. 2) to receive the sensing signal output from the sensing driving chip T-IC and may deliver the received signal to the sensing driving chip T-IC.

Figure 6:
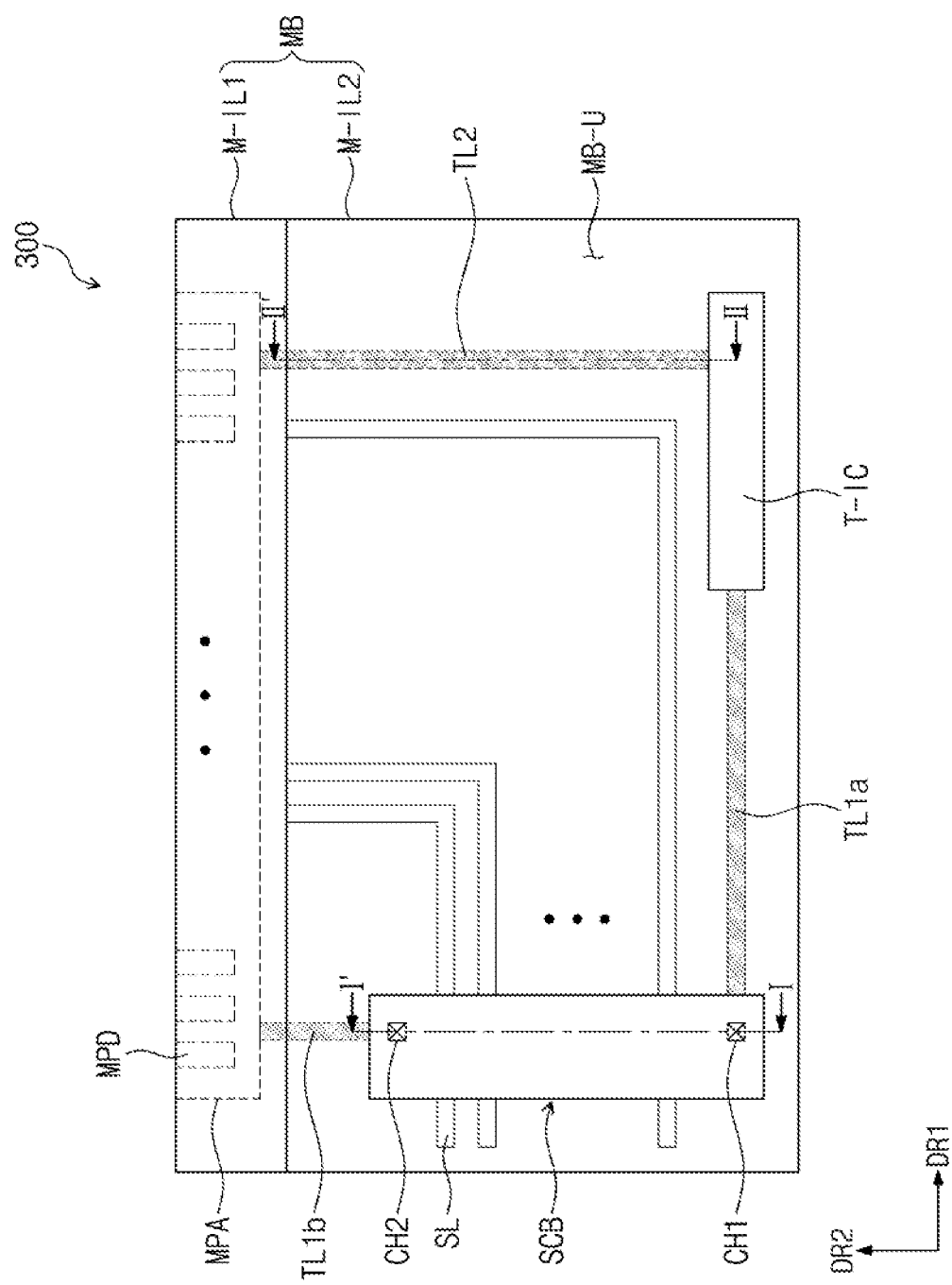
FIG. 6 illustrates an embodiment of a circuit board.
Figure 7:
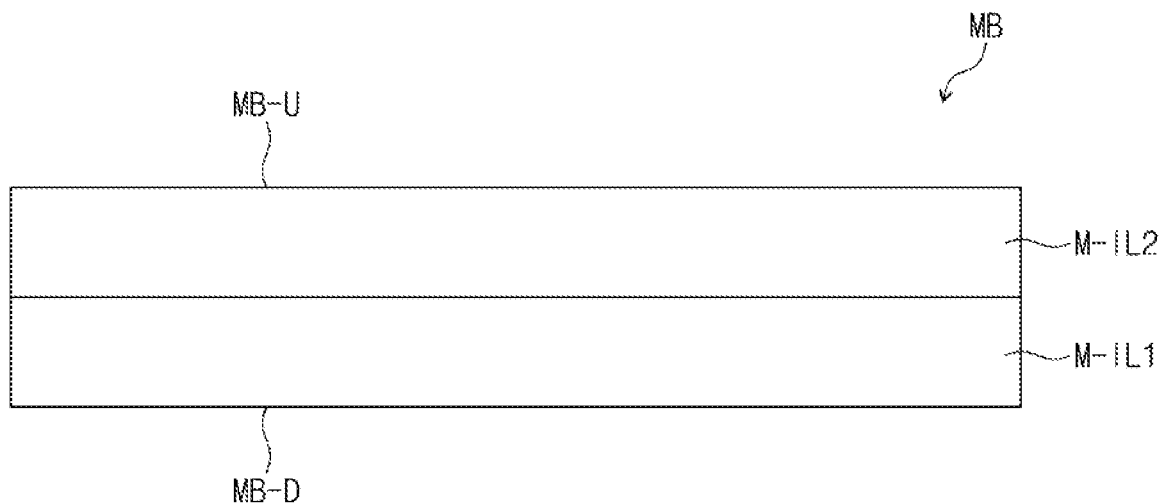
FIG. 7 illustrates an embodiment of a circuit board.
Figure 8:
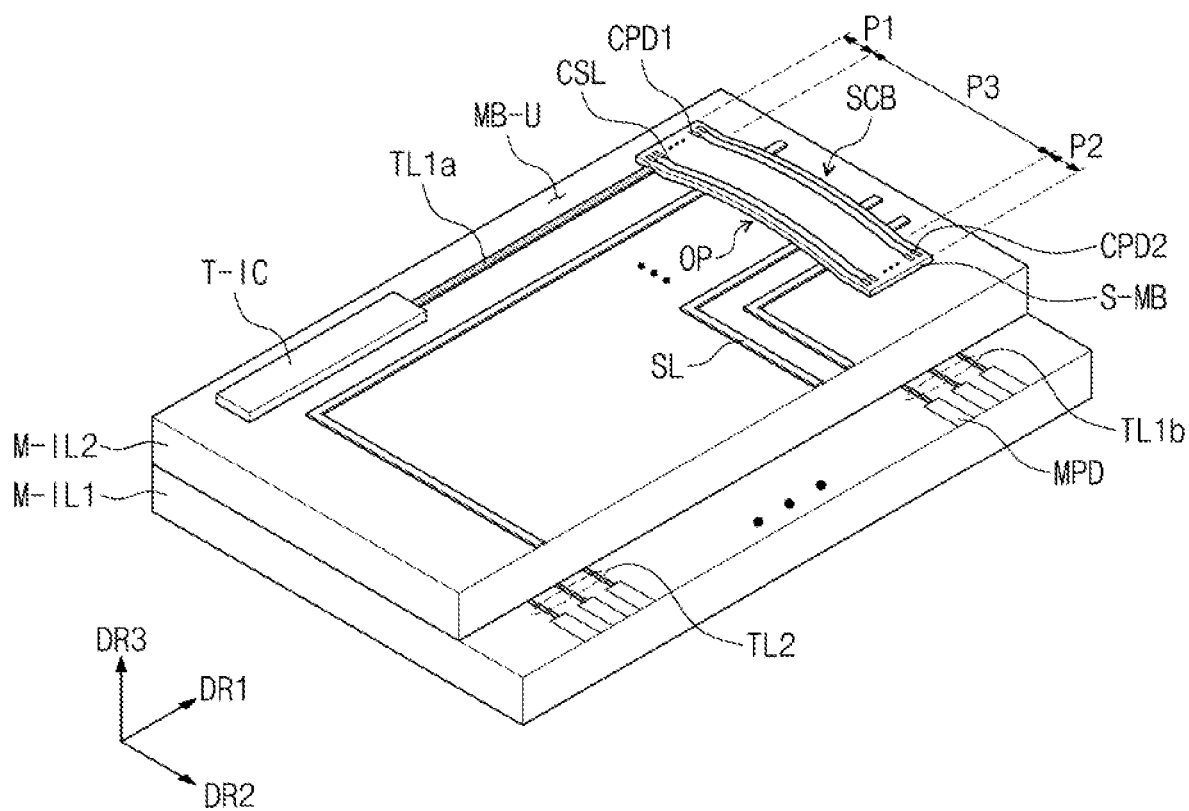
FIG. 8 illustrates an embodiment of a circuit board.
Figure 9A:
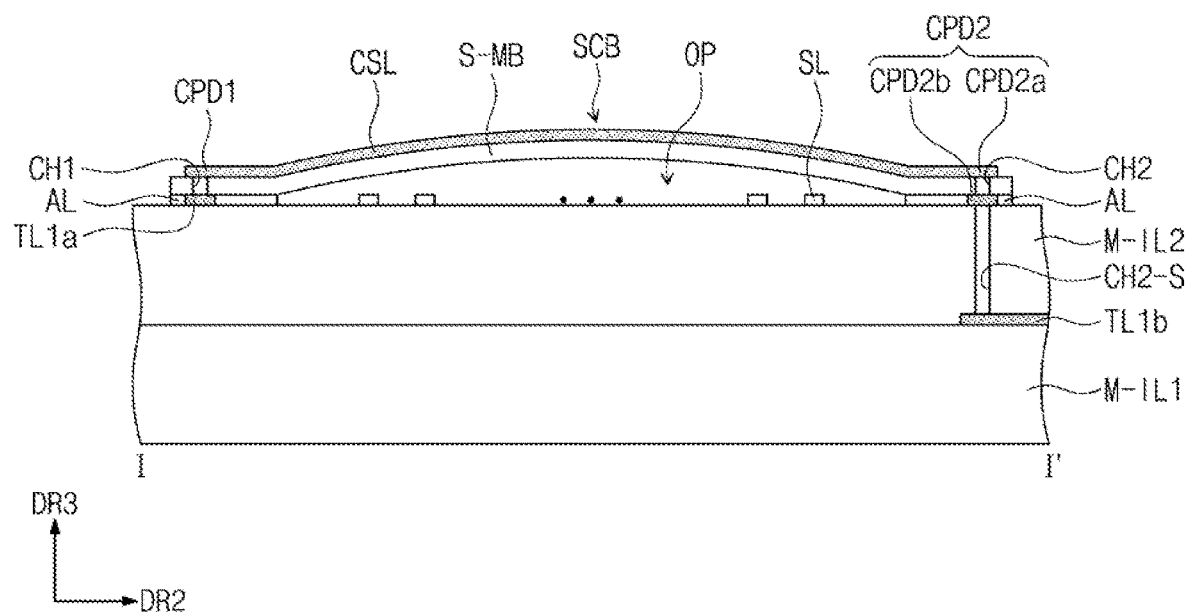
FIG. 9A illustrates a cross-sectional view taken along section line I-I' in FIG. 6.
Figure 9B:
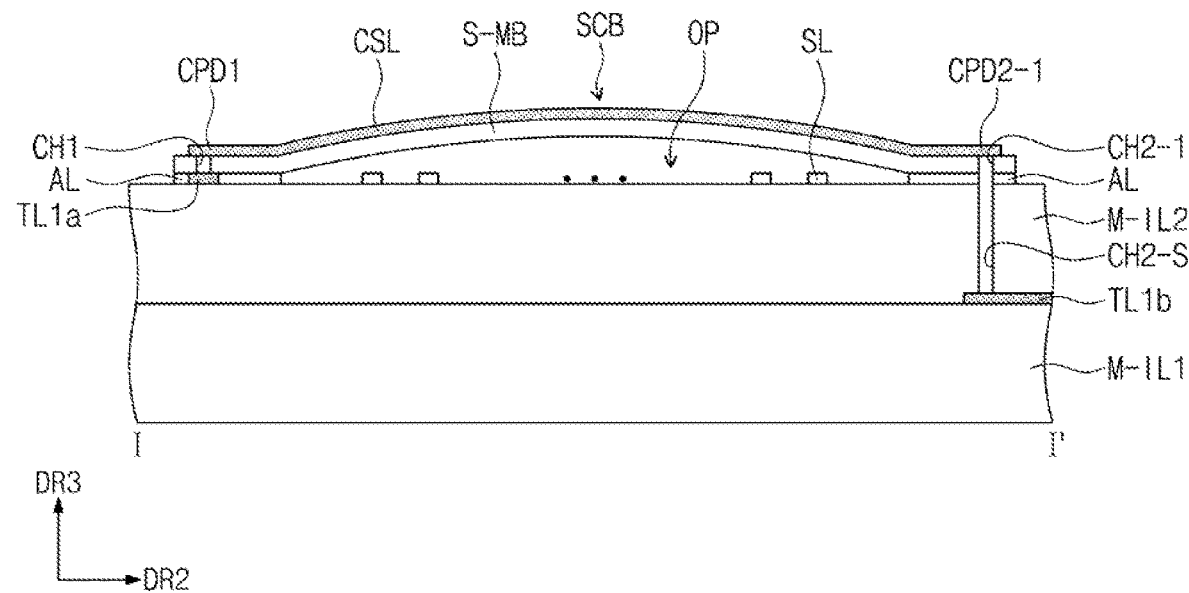
FIG. 9B illustrates another cross-sectional view taken along section line I-I' in FIG. 6.

FIG. 6 is a plan view of the circuit board 300 according to an embodiment of the inventive concept. FIG. 7 is a cross-sectional view of the circuit board according to an embodiment of the inventive concept. FIG. 8 is a perspective view of a circuit board according to an embodiment of the inventive concept. FIG. 9A is a sectional view cut along I-I' shown in FIG. 6 according to an embodiment of the inventive concept. FIG. 9B is a sectional view cut along I-I' shown in FIG. 6 according to another embodiment of the inventive concept.

Referring to FIG. 6, the circuit board 300 may further include first signal lines, second signal lines SL, and driving pads MPD other than the sensing driving chip T-IC, the main circuit board MS, and the sub-circuit board SCB as shown in FIG. 2. The circuit board 300 may define the pad area MPA, and the driving pads MPD may be arranged in the pad area MPA. In one embodiment, the driving pads MPD may be considered to be a pad unit or area.

The main circuit board MB may support the components of the circuit board 300, and, for example, may include top surface MB-U and the bottom surface opposite to the top surface MB-U. In one embodiment, the top surface MB-U of the main circuit board MB may be a surface on which the sensing driving chip T-IC and the sub-circuit board SCB are arranged.

Referring to FIG. 7, the main circuit board MB may include a first insulation layer M-IL1 and a second insulation layer M-IL2 arranged on the first insulation layer M-IL1. The bottom surface MB-D of the first insulation layer M-IL1 may correspond to the bottom surface of the main circuit board MB. The top surface MB-U of the second insulation layer M0IL2 may correspond to the top surface MB-U of the main circuit board MB. The sensing driving chip T-IC and the sub-circuit board SCB may be arranged on the top surface MB-U of the second insulation layer M-IL2.

Referring again to FIG. 6, the first signal lines may include a first sensing line TL1a and TL1b and a second sensing line TL2 may be electrically connected to the sensing driving chip T-IC. For convenience of description, only one of each of the first sensing line TL1a and TL1b or the second sensing line TL2 are shown, but a plurality of such lines may be provided and electrically connected to the driving pads MPD in one embodiment.

The sensing driving chip T-IC may provide the first sensing signals to the driving pads MPD through the sub-circuit board SCB and the first sensing line TL1a and TL1b. The first sensing line TL1a and TL includes a first sub-line TL1a and a second sub-line TL1b spaced apart from each other. The first sub-line TL1a electrically connects the sensing driving chip T-IC and the sub-circuit board SCB, and the second sub-line TL1b electrically connects the sub-circuit board SCB and the driving pads MPD.

As described above, the sub-circuit board SCB may electrically connect the first sub-line TL1a and the second sub-line TL1b. As a result, the first sensing signals output from the sensing driving chip T-IC may be provided to the driving pads MPD.

The sensing driving chip T-IC may provide second sensing signals to the driving pads MPD through the second sensing line TL2. The second sensing line TL2 may electrically connect the sensing driving chip T-IC and the driving pads MPD.

The first sensing signals output from the sensing driving chip T-IC may be delivered through the driving pads MPD to the sensing pads IPD (e.g., see FIG. 6) electrically connected to the driving pads MPD. The sensing pads IPD may provide the first sensing signals to the first sensing electrodes. The second sensing signals output from the sensing driving chip T-IC may be delivered through the driving pads MPD to the sensing pads IPD electrically connected to the driving pads MPD. The sensing pads IPD may provide the second sensing signals to the second sensing electrodes.

The second signal lines SL may be arranged on the top surface MB-U of the main circuit board MB and on the same layer (either partially or fully) as the sensing driving chip T-IC. The second signal lines SL may be insulated from each of the sub-circuit board SCB and the first signal lines. The second signal lines SL may be electrically connected to the driving pads MPD to deliver image signals to the pixel driving chip D-OC, for example, as shown in FIG. 2. The second signal lines SL may be electrically connected to an external driving element to receive the image signals.

According to an embodiment of the inventive concept, the sub-circuit board SCB may have the structure spaced apart from the top surface MB-U of the main circuit board MB. Through the space, the second signal lines SL may be arranged on the top surface MB-U of the main circuit board MB.

Referring to FIG. 8, the driving pads MPD may be arranged on the first insulation layer M-IL1. An area of the first insulation layer M-IL1 (in which the driving pads MPD are arranged) may not overlap the second insulation layer M-IL2 in the third direction DR3. For example, part of the first insulation layer M-IL1 (in which the driving pads MPD are arranged) may be exposed by the second insulation layer M-IL2. The exposed part of the first insulation layer M-IL1 may be electrically bonded to one end of the display module 300 through the driving pads MPD.

The sub-circuit board SCB may be divided into a first part P1, a second part P2, and a central part P3 between the first part P1 and the second part P2. Each of the first part P1 and the second part P2 of the sub-circuit board SCB may have a structure adhered to the top surface MB-U of the main circuit board MB. The central part P3 of the sub-circuit board SCB may have a structure spaced apart from the top surface MB-U of the main circuit board MB. Collectively, the first part P1, the second part P2 and the third part P3 may be coupled to the main circuit board MB in a bridge structure.

According to an embodiment of the inventive concept, the central part P3 may have a greater area than the sum of the first part P1 and the second part P2 in a plan view. However, the inventive concept is not limited thereto, and the central part P3 may have a greater area than each of the first part P1 and the second part P2.

When the first part P1 and the second part P2 have structures adhered to the top surface MB-U of the main circuit board MB through an adhesive layer, a space OP may be defined between the central part P3 and the top surface MB-U of the main circuit board MB in the bridge structure. For example, the sub-circuit board SCB may have a tunnel or bridge shape in which central part P3 is spaced apart from the top surface MB-U of main circuit board MB.

As a result, at least part of the second signal lines SL may overlap or cross with the sub-circuit board SCB to be arranged on the top surface MB-U of the main circuit board MB. According to the above-described, the number of the signal lines arranged on the circuit board 300 may increase, and as a result the efficiency of the circuit board 300 may increase.

In addition, the sub-circuit board SCB includes first pads CPD1, second pads CPD2, and connection signal lines CSL. The first pads CPD1, the second pads CPD2, and the connection signal lines CSL may be provided in an integrated shape through the same process or different processes, and arranged on the top surface of the sub-circuit board SCB. The bottom surface of the sub-circuit board SCB faces the top surface MB-U of the main circuit board MB. The top surface of the sub-circuit board SCB may be opposite to the bottom surface of sub-circuit board SCB.

The first pads CPD1 are arranged on the top surface of the sub-circuit board SCB, which corresponds to the first part P1. The second pads CPD2 are arranged on the top surface of the sub-circuit board SCB, which corresponds to the second part P2. The connection signal lines CSL may be arranged on the top surface of the sub-circuit board SCB to electrically connect the first pads CPD1 and the second pads CPD2.

According to an embodiment of the inventive concept, the first sub-line TL1a and the second sub-line TL12 may be arranged on different layers. As shown in the example of FIG. 8, the first sub-line TL1a may be arranged on the second insulation layer M-IL2, and the second sub-line TL1b may be arranged on the first insulation layer M-IL1. The second sub-line TL1b may be arranged on a different layer from the sensing driving chip T-IC, and on the same layer (either partially or fully) as the driving pads MPD (hereinafter, described as pad unit or area).

The second sensing line TL2 may be arranged on the first insulation layer M-IL1, which is a different layer from the sensing driving chip T-IC, and electrically connected to the pad unit MPD. The second sub-line TL1b and the second sensing line TL2 may be arranged on the same layer (either partially or fully).

Referring to FIG. 9A, the first part P1 and the second part P2 of the sub-circuit board SCB (as shown in FIG. 8) may be adhered to the second insulation layer M-IL2 through the adhesive layer AL. For example, the adhesive layer AL may be an epoxy-type adhesive. The central part P3 of the sub-circuit board SCB may not overlap the adhesive layer AL and may be spaced apart from the second insulation layer M-IL2 to define the space OP.

The first sub-line TL1a may be arranged on the second insulation layer M-IL2, which is the same layer (either partially or fully) as the sensing driving chip T-IC. The first sub-line TL1a may be electrically connected to the first pad CPD1 through the first contact hole CH1 in the sub-circuit board SCB. The first contact hole CH1 may be, for example, a via hole for electrically connecting the first sub-line TL1a and the first pad CPD1.

According to an embodiment, the second pad CPD2 may include a first sub-pad CPD2a and a second sub-pad CPD2b. In this case, the first pad CPD1, the connection signal line CSL, and the first sub-pad CPD2a may be provided in an integrated shape, and the second sub-pad CPD2b may be provided in another process.

The first sub-pad CPD2a is arranged on the top surface of the sub-circuit board SCB, and the second sub-pad CPD2b may be arranged on the second insulation layer M-IL2. The first sub-pad CPD2a may be electrically connected to the second sub-pad CPD2b through the second contact hole CH2 in the sub-circuit board SCB, which corresponds to the second part P2. The second contact hole CH2 may be, for example, a via hole for electrically connecting the first sub-pad CPD2a and the second sub-pad CPD2b.

The second sub-pad CPD2b may be electrically connected to the second sub-line TL1b through a sub-contact hole CH2-S in the second insulation layer M-IL2 overlapping the second part P2. The second sub-line TL1b may be arranged on the first insulation layer M-IL1 and connected to the pad unit MPD. For example, the second sub-line TL1b and the pad unit MPD may be provided in an integrated shape through the same process or different processes. The sub-contact hole CH2-S may be, for example, a via hole for electrically connecting the second sub-pad CPD2b and the second sub-line TL1b.

The first sensing signal output from the sensing driving chip T-IC may be delivered to the first pad CPD1 through the first sub-line TL1a. The first sensing signal delivered to the first pad CPD1 may be delivered to the second sub-line TL1b through the connection signal line CSL and the second pad CPD2.

Accordingly, as described above, the first sub-line TL1a may be arranged on the top surface MB-U of the main circuit board MB. Remaining components for delivering the first sensing signal may be arranged on a layer different from the top surface MB-U of the main circuit board MB. For example, the second signal lines SL may cross with the sub-circuit board SCB through a space OP2 between the sub-circuit board SCB and the second insulation layer M-IL2. As a result, the number of the second signal lines SL arranged on the top surface MB-U of the main circuit board MB may increase.

In FIG. 9B, the structures of the second pad CPD-1 and the second contact hole CH2-1 are modified in comparison to FIG. 9A. The structures of the remaining components may be substantially the same. Hereinafter, the structures of the second pad CPD-1 and the second contact hole CH2-1 will be mainly described through FIG. 9B.

Referring to FIG. 9B, the second pad CPD2-1 may be arranged on the sub-circuit board SCB through the same process as those of the first pad CPD1 and the connection signal line CSL, or may be arranged using different processes. The second pad CPD2-1 may be electrically connected to the second sub-line TL1b through the second contact hole CH2-1. The second contact hole CH2-1 may be, for example, a via hole penetrating through the sub-circuit board SCB, the adhesive layer AL and the second insulation layer M-IL2, which correspond to the second part P2. For example, the first sensing signal delivered to the second pad CPD2-1 may be delivered to the second sub-line TL1b through the second contact hole CH2-1.

Figure 10:
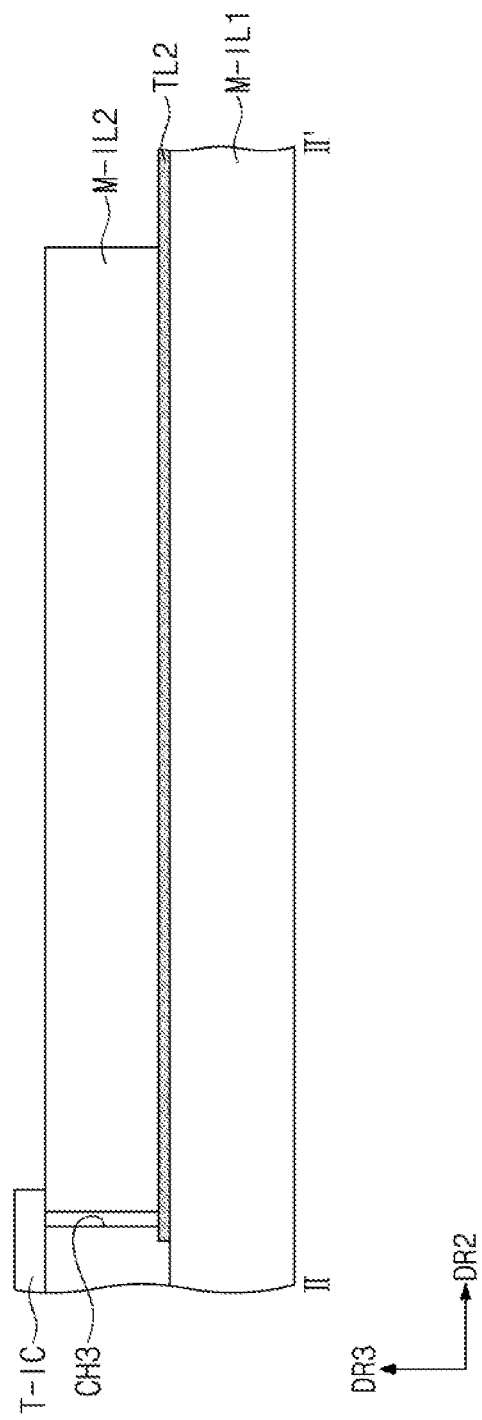
FIG. 10 illustrates a cross-sectional view taken along line II-II' in FIG. 6.

FIG. 10 is a cross-sectional view taken along section line II-II' in FIG. 6 according to an embodiment of the inventive concept. Referring to FIG. 10, the second sensing line TL2 may be arranged on the first insulation layer M-IL1. The second sensing line TL2 may be electrically connected to the sensing driving chip T-IC through a third contact hole CH3 in the second insulation layer M-IL2. The third contact hole CH3 may be, for example, a via hole for electrically connecting the sensing driving chip T-IC and the second sensing line TL2. The second sensing signal output from the sensing driving chip T-IC may be delivered to the second sensing line TL2 through the third contact hole CH3.

Figure 11A:
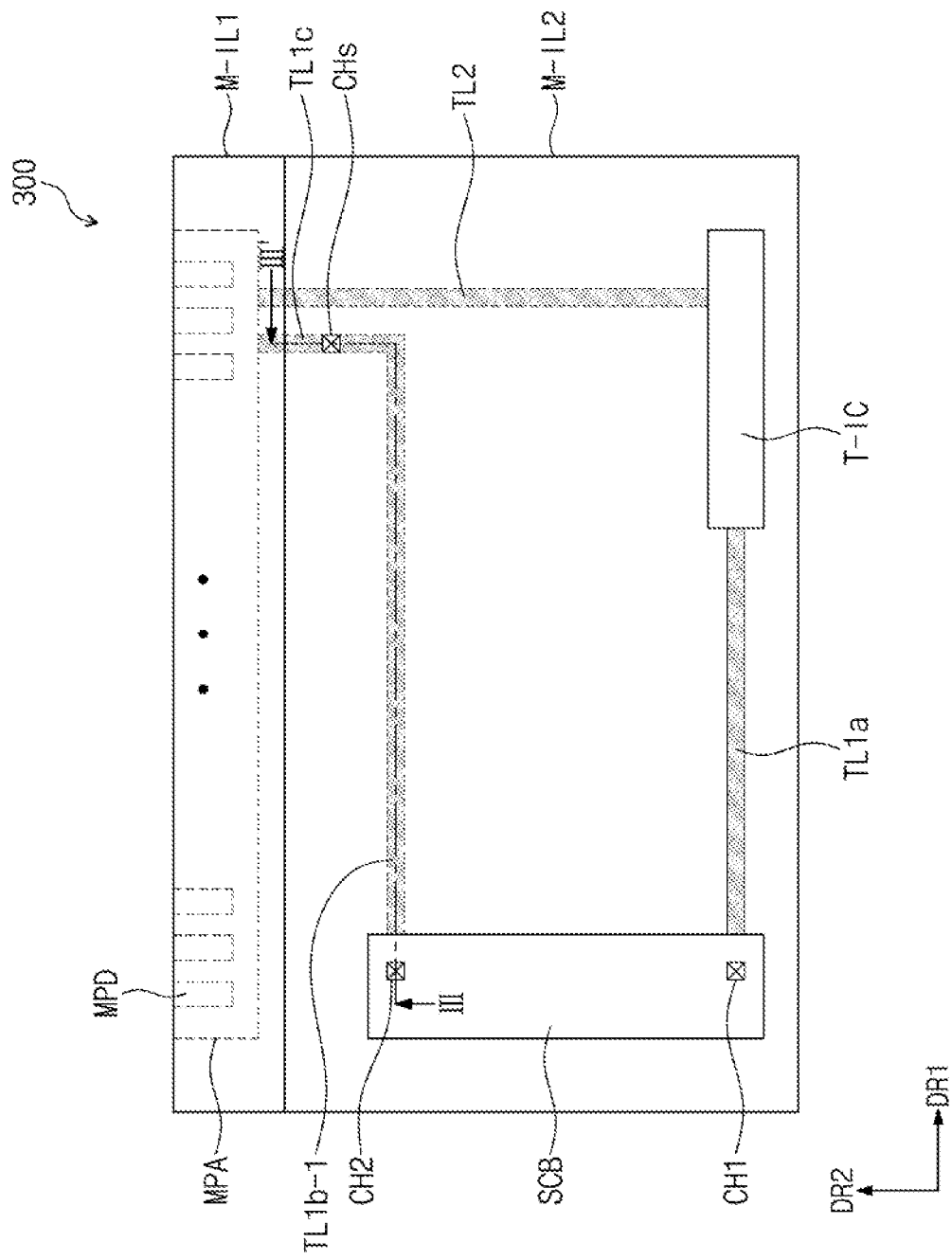
FIG. 11A illustrates an embodiment of a circuit board.
Figure 11B:
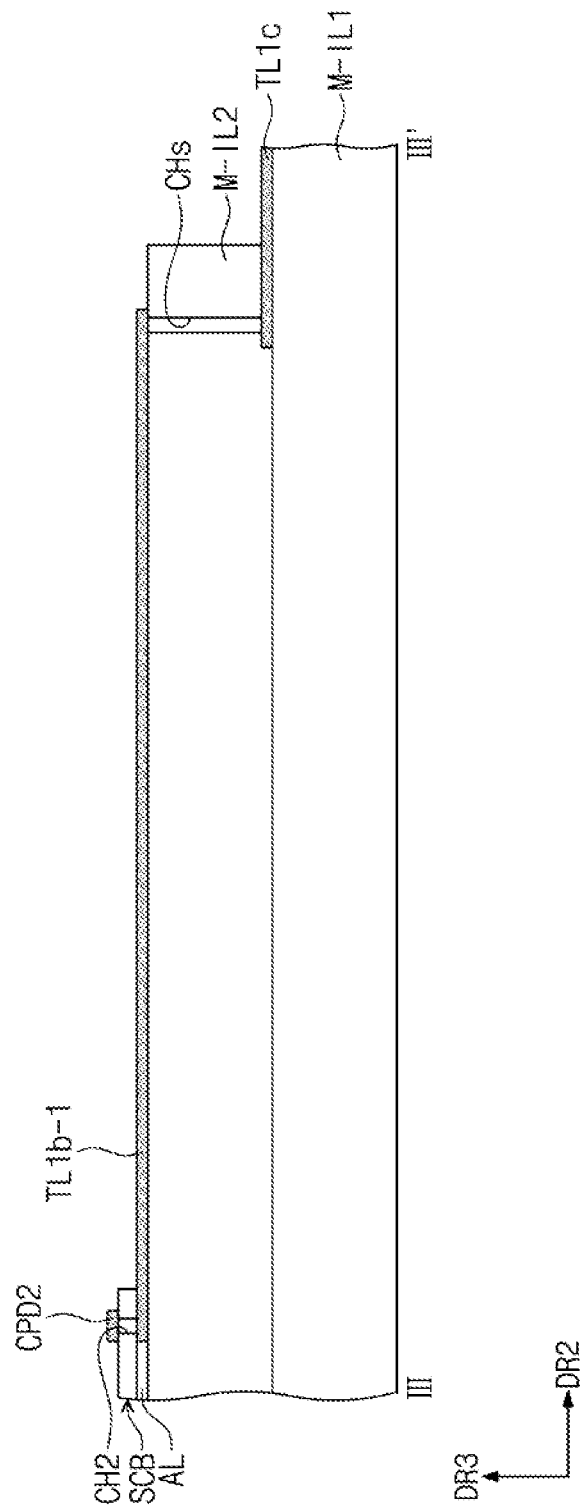
FIG. 11B illustrates a cross-sectional view taken along section in FIG. 11A.

FIG. 11A is a plan view of a circuit board according to an embodiment, and FIG. 11B is a cross-sectional view taken along section line in FIG. 11A according to an embodiment of the inventive concept. In FIGS. 11A and 11B, only the structure of the second sub-line TL1b-1 is modified and the component of a third sub-line TL1c is added in comparison to the embodiment shown in FIG. 6. The structures of the remaining components may be substantially the same. Accordingly, the structure of the second sub-line TL1b-1 will be mainly described through FIGS. 11A and 11B.

Referring to FIGS. 11A and 11B, the second sub-line TL1b-1 and the third sub-line TL1c may be arranged on different layers. For example, the second sub-line TL1b-1 may be arranged on the second insulation layer M-IL2 and electrically connected to the second pad CPD2 through the second contact hole CH2 in the sub-circuit board SCB. For example, according to one embodiment, the second sub-line TL1b-1 may be arranged on the same layer (either partially or fully) as the first sub-line TL1a. The second sub-line TL1b-1 may be electrically connected to the third sub-line TL1c through a contact hole CHs in the second insulation layer M-IL2. The contact hole CHs may be a via hole, for example, to electrically connect the second sub-line TL1b-1 and the third sub-line TL1c.

In this case, the second signal lines SL shown in FIG. 6 may cross with the sub-circuit board SCB in a plan view through the space OP (e.g., see FIG. 8) between the sub-circuit board SCB and the second insulation layer M-IL2. In addition, the second signal lines SL may be insulated from and cross with the second sub-line TL1b-1 through contact holes defined in the second insulation layer M-IL2 in a plan view. Through this, the second signal lines SL may be electrically connected to the pad unit MPD. The arrangement structure of the second sub-line TL1b-1 is not limited to the example embodiments described above and may be variously modified to be arranged on the second insulation layer M-IL2. For example, the second signal lines SL may have the structure arranged between the second sub-line TL1b-1 and the second sensing line TL2 in a plan view.

In accordance with one embodiment, an apparatus includes a first circuit board, a chip coupled to the first circuit board, and a second circuit board electrically connected to the driving chip. The first circuit board may correspond, for example, to the main circuit board and the second circuit board may correspond, for example, to the sub-circuit board as described herein. In another embodiment, one or more of the first or second circuit boards may be different from respective ones of the main circuit board and the sub-circuit board.

The second circuit board may include a first area coupled to a first location of the first circuit board and a second area coupled to a second location of the first circuit board. The first location and the second location may be on a same surface or side of the first circuit board, for example, as illustrated in FIG. 8. In one embodiment, the first and second locations may be on different surfaces or sides of the first circuit board. The second circuit board may also include a third area between the first area and the second area. The third area may be spaced from the same surface of the first circuit board and may include one or more first signal lines, for example, as also illustrated in FIG. 8.

Additionally, the first circuit board may include one or more second signal lines overlapping the one or more first signal lines of the second circuit board. The one or more first signal lines may carry corresponding signals to the chip through a first pad area or are configured to carry corresponding signals from the chip to a second pad area. The first and second pad areas may be on the second circuit board, or one or more of these pad areas may be on the first circuit board.

In accordance with one or more of the aforementioned embodiments of the inventive concept, the circuit board may include a main circuit board and a sub-circuit board. All or a portion of the sub-circuit board may be separated from the main circuit board, and the sub-circuit board may be provided on the main circuit board.

Also, first signal lines for delivering a sensing signal and second signal lines for delivering an image signal may be provided on the main circuit board. For example, part of the first signal lines may be electrically connected to the display module through the sub-circuit board. The number of the second signal lines capable of being arranged on the main circuit board may therefore be increased. As a result, since the number of the second signal lines to be arranged on the main circuit board may increase, the efficiency of the circuit board may be enhanced.

As described above, the embodiments are disclosed in the drawings and the specification. Herein, specific terms have been used, but are just used for the purpose of describing the inventive concept and are not used for defining the meaning or limiting the scope of the inventive concept, which is disclosed in the appended claims. Thus it would be appreciated by those skilled in the art that various modifications and other equivalent embodiments can be made. Therefore, the true technical scope of the inventive concept shall be defined by the technical spirit of the appended claims.

What is claimed is:

1. An apparatus, comprising:
a first circuit board including first signal lines and second signal lines;
a driving chip coupled to the first circuit board; and
a second circuit board spaced apart from and electrically connected to the driving chip, wherein the second circuit board is a flexible circuit board and wherein at least part of the second circuit board is spaced apart from a first surface of the first circuit board in a bridge structure, each of the first signal lines has different sub-lines that are spaced apart from one another and located on different insulation layers, a portion of a second insulation layer having a smaller size than a first insulation layer to expose a portion of the first insulation layer, the exposed portion of the first insulation layer including a pad area.

2. The apparatus of claim 1, wherein at least part of the second circuit board which is spaced apart from the first surface of the first circuit board has a greater area than another part of the second circuit board that is coupled to the first circuit board.

3. The apparatus of claim 1, wherein the second circuit board comprises:
a first part coupled to the first surface of the first circuit board;
a second part spaced apart from the first part and coupled to the first surface of the first circuit board; and
a third part between the first and second parts and separated from the first surface of the first circuit board by a space, the second signal lines passing through the space between the first surface of the first circuit board and the third part of the second circuit board.

4. The apparatus of claim 3, wherein the second signal lines are electrically insulated from the driving chip and are arranged on the first surface of the first circuit board, wherein at least part of the second signal lines overlap the third part.

5. The apparatus of claim 1, wherein the first signal lines are electrically connected to the driving chip and the pad area.

6. The apparatus of claim 5, wherein each of the first signal lines comprise:
a first sensing line electrically connected to the pad area through the second circuit board; and
a second sensing line configured to receive a different electrical signal from the first sensing line and coupled to the pad area.

7. The apparatus of claim 6, wherein each of the first sensing lines comprise:
a first sub-line configured to electrically connect the driving chip and the second circuit board, the first sub-line arranged on the first surface of the first circuit board; and
a second sub-line configured to electrically connect the second circuit board and the pad area, wherein the first sub-line and the second sub-line are arranged on different layers.

8. The apparatus of claim 7, wherein the second sub-line is arranged on a different layer from the driving chip and on a same layer as the pad area.

9. The apparatus of claim 6, wherein the second sensing line is arranged on a different layer from the driving chip and on a same layer as the pad area.

10. The apparatus of claim 6, wherein the first circuit board comprises:
the first insulation layer; and
the second insulation layer arranged on the first insulation layer and comprising the driving chip and the second circuit board arranged thereon, wherein the first surface of the first circuit board corresponds to a first surface of the second insulation layer.

11. The apparatus of claim 10, wherein each of the first sensing lines comprise:
a first sub-line configured to electrically connect one end of the second circuit board and the driving chip, the first sub-line arranged on the second insulation layer; and
a second sub-line configured to electrically connect another end of the second circuit board and the pad area, the second sub-line arranged on the first insulation layer.

12. The apparatus of claim 5, wherein the second signal lines are electrically insulated from each of the driving chip and the first signal lines, and wherein the second signal lines are arranged on the first surface of the first circuit board and are configured to be electrically connected to the pad area and wherein at least part of each of the second signal lines overlap a portion of the second circuit board.

13. The apparatus of claim 1, further comprising:
the pad area electrically connected to the second circuit board;
wherein the first signal lines include a sensing line configured to electrically connect the driving chip and the pad area through the second circuit board.

14. The apparatus of claim 13, wherein each of the first sensing lines comprise:
a first sub-line configured to electrically connect the driving chip and one end of the second circuit board, the first sub-line arranged on the first surface of the first circuit board;
a second sub-line arranged on a same layer as the first sub-line and electrically connected to another end of the second circuit board; and
a third sub-line configured to electrically connect the second sub-line and the pad area.

15. The apparatus of claim 14, wherein the third sub-line is arranged on a different layer from the second sub-line and on a same layer as the pad area.

16. The apparatus of claim 1, further comprising:
an adhesive layer between the second circuit board and the first surface of the first circuit board.

17. A display device, comprising:
a substrate;
a display element layer on the substrate;
an input sensing layer arranged on the display element layer and comprising a sensing electrode; and
a board arrangement coupled to one end of the substrate and comprising:
a first circuit board coupled to the one end of the substrate;
a driving chip coupled to the first circuit board and electrically connected to the sensing electrode; and
a second circuit board electrically connected to the driving chip and comprising an adhesion part arranged on a first surface of the first circuit board and a spaced part spaced apart from the first surface of the first circuit board, and wherein the display device further comprises:
a signal line electrically connected to the driving chip; and
a pad area configured to electrically connect the signal line and the sensing electrode, wherein the signal line comprises:

a first sub-line electrically connected to the second circuit board through a first contact hole in the first part; and a second sub-line connected to the second circuit board through a second contact hole in the second part, and wherein the first sub-line and the second sub-line are arranged on different layers.

18. The display device of claim 17, wherein the spaced part has a greater area than the adhesion part.

19. The display device of claim 17, wherein:

the adhesion part comprises a first part spaced apart from a second part, the spaced part is between the first part and the second part, and a space is between the spaced part and the first surface of the first circuit board.

20. An apparatus, comprising:

a first circuit board including first signal lines and second signal lines;

a chip coupled to the first circuit board; and a second circuit board electrically connected to the chip, wherein the second circuit board includes a first area coupled to a first location of the first circuit board and a second area coupled to a second location of the first circuit board, the first location and the second location on a same surface of the first circuit board, and wherein the second circuit board includes a third area between the first area and the second area, the third area spaced from the same surface of the first circuit board and including one or more first signal lines, and wherein the first circuit board includes one or more second signal lines overlapping the one or more first signal lines of the second circuit board, and wherein each of the first signal lines has different sub-lines that are spaced apart from one another and are located on different insulation layers, a portion of a second insulation layer having a smaller size than a first insulation layer to expose a portion of the first insulation layer, the exposed portion of the first insulation layer including a pad area.

21. The apparatus of claim 20, wherein:

the one or more first signal lines are configured to carry corresponding signals to the chip through a first pad area or are configured to carry corresponding signals from the chip to a second pad area, the first and second pad areas on the second circuit board.

\* \* \* \* \*